United States Patent [19]

Uchida et al.

[11] Patent Number: 4,758,734

[45] Date of Patent: Jul. 19, 1988

[54] HIGH RESOLUTION IMAGE SENSOR ARRAY USING AMORPHOUS PHOTO-DIODES

[75] Inventors: Hiroyuki Uchida; Setsuo Kaneko; Toshio Okubo, all of Tokyo, Japan

[73] Assignee: NEC Corporation, Tokyo, Japan

[21] Appl. No.: 710,679

[22] Filed: Mar. 12, 1985

[30] Foreign Application Priority Data

| Mar. 13, 1984 | [JP] | Japan | 59-47836 |
| May 9, 1984 | [JP] | Japan | 59-92136 |
| May 9, 1984 | [JP] | Japan | 59-92138 |
| Jun. 29, 1984 | [JP] | Japan | 59-134313 |

[51] Int. Cl.[4] .............. H01L 27/14; H04N 5/30
[52] U.S. Cl. ................. 250/578; 250/211 R; 357/30; 358/213.11; 358/213.28
[58] Field of Search ........... 250/578, 211 R, 211 J; 358/212–213, 294, 213.11, 213.23, 75, 213.28; 357/24 LR, 30–32, 2, 30 H

[56] References Cited

U.S. PATENT DOCUMENTS

| 4,499,384 | 2/1985 | Segawa et al. | 250/578 |
| 4,542,409 | 9/1985 | Ochi | 358/213 |
| 4,556,800 | 12/1985 | Ohta et al. | 250/578 |
| 4,565,928 | 1/1986 | Yamamoto et al. | 250/578 |
| 4,584,607 | 4/1986 | Miyazawa | 358/213 |

OTHER PUBLICATIONS

Yamamoto et al., High Speed Contact Type Linear Sensor Array Using a-Si Pin Diodes, Extended Absts. of the 15th Conf. on Solid State Devices & Materials, 1983, pp. 205-208.

Primary Examiner—Edward P. Westin
Attorney, Agent, or Firm—Burns, Doane, Swecker & Mathis

[57] ABSTRACT

An image sensor array comprises an insulating substrate, a plurality of individual electrodes formed on the substrate, a plurality of blocking diodes formed on the respective individual electrodes, a plurality of photo diodes formed on the blocking diodes to form a plurality of series connections of a blocking diode and a photo diode, a plural number of common electrodes of a transparent conductor material, each of the common electrodes covering one of the photo diodes on the same individual electrodes, and a filter covering portions of the common electrodes above the photo diodes. A photo-shielding layer of metal, amorphous silicon, amorphous germanium or amorphous silicon germanium may be interposed between the blocking diode and the photo diode.

13 Claims, 10 Drawing Sheets

HIGH RESOLUTION IMAGE SENSOR ARRAY USING AMORPHOUS PHOTO-DIODES

BACKGROUND OF THE INVENTION

1. Field of the Invention

This invention relates to an image sensor array using amorphous silicon photo-diodes, and more particularly to a structure for improving the resolution of a color image.

2. Description of the Prior Art

A contact type image sensor has been recently developed for use in facsimile equipment. Since the contact type image sensor can be formed in the same size as the document to be read, an optical lens system can be removed from the facsimile equipment to make the equipment compact.

As a semiconductor material of photo-diodes, amorphous silicon (hereinafter, referred to as α-Si) has been widely used in contact type image sensors. The α-Si was deposited on individual electrodes formed on an insulating substrate. Transparent electrodes were formed on the α-Si as common electrodes. The photodiodes were formed at the interface between the α-Si and the common electrodes by using a transparent metal which formed a Schottky junction with the α-Si as the common electrode. Alternatively, the photo-diodes were formed in the α-Si as P-N diodes or PIN diodes by introducing appropriate impurities into the α-Si. Color filters of red, green and blue are formed on parts of the common electrode positioned upon the individual electrodes. The red, green and blue filters are serially arranged in a line.

The photo carriers accumulated in the photo-diodes were sequentially read out from the individual electrodes. Such reading was performed by scanning switches which are respectively connected between a power source and the individual electrodes. An example of the switches is an MOS field effect transistor. One picture element of a color image was reproduced by using three outputs from photo-diodes positioned under the red, green and blue filters. Here, these three filters were arranged in a line. Therefore, the resolution of the reproduced picture was low, compared with a reproduced monochrome picture. Such low resolution may be improved by increasing the density of the photo-diodes. However, the increment of the density results in a minimization of each photo-diode. This causes a deterioration of the S/N ratio in output signals.

Such low resolution may alternatively be improved by arranging the photo-diodes and color filters in three parallel lines so as to form a red line, a blue line and a green line. However, in such a structure, all three sets of the photo-diodes and the color filters are formed on one individual electrode. Such structure cannot read out the photo carriers from a selected one of the photo-diodes. That is, the photo carriers accumulated in the other two photo-diodes which are formed on the same individual electrode cannot be prevented from being read out together. Thus, the reproducibility of color image may be poor.

H. Yamamoto et al proposed the use of a blocking diode connected in series with a photo diode in "Extended Abstracts of the 15th Conference on Solid State Devices and Materials" 1983, pages 205 to 208. The blocking diode and the photo diode are formed side by side on an insulating substrate and connected in series by wiring layers. All the blocking diodes and the photo diodes are arranged in lines. Therefore, the resolution in the reproduced picture was poor. Many complicated wirings and wide areas were required on the insulating substrate. This means the color image sensor could not be formed compactly.

SUMMARY OF THE INVENTION

The primary object of the present invention is to provide an image sensor array by which an image of high resolution and high S/N ratio can be reproduced.

Another object of the present invention is to provide a color image sensor array by which an image of high color fidelity can be reproduced.

According to the present invention, there is provided an image sensor array which comprises a substrate, a plurality of individual electrodes formed on the substrate in parallel with each other, a plurality of blocking diodes formed on the individual electrodes so that a plural number of blocking diodes exist on each individual electrode, a plurality of photo-diodes formed on the blocking diodes so as to form a series connection of forward and backward biased diodes, a plurality of filters covering the photo-diodes, and a plural number of transparent common electrodes, each being formed on the respective ones of the photo-diodes on the respective individual electrodes.

There is further provided an improved color image sensor array of the above-mentioned color image sensor array, wherein the filters include first color filters of a first color, second color filters of a second color and third color filters of a third color, the first, second and third colors being colors necessary to reproduce a color image, the first, second and third color filters covering the photo diodes on the respective individual electrodes, characterized in that a light-shielding layer is interposed between each of the photo diodes and each of the associated blocking diodes.

According to the image sensor array of the present invention, a plural number of sets of the blocking diodes, the photo-diodes and the filters are formed on one individual electrode, and individual electrodes are formed in parallel with each other. Therefore, the high resolution in a reproduced picture or color picture is obtained. Here, the minimization of each photo diode is not required. Thus, the S/N ratio in output signals is held at a high level.

The blocking diodes are respectively formed under the photo-diodes. Therefore, the flow of photo carriers in the photo-diodes is blocked by appropriate potential applied to the common electrode. In case of a color image sensor, if two of the common electrodes are held at the appropriate potential which backward biases the blocking diode, the photo carriers in the photo diodes under the remaining common electrode are exclusively read out in response to scanning of the individual electrodes. This results in high color fidelity of a reproduced picture.

According to the improved color image sensor array of the present invention, a conductive photo-shield layer is interposed between the blocking diode and the photo-diode. If there is no photo-shield layer, a part of light radiated on non-selected photo-diodes reaches the blocking diodes thereunder, allowing the read out of photo carriers generated in the blocking diode and resulting in poor color fidelity in a reproduced color picture. However, such light is prevented from reaching the blocking diodes by the conductive photo-shield layer. Thus, the color fidelity in the reproduced picture is further improved.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1A:
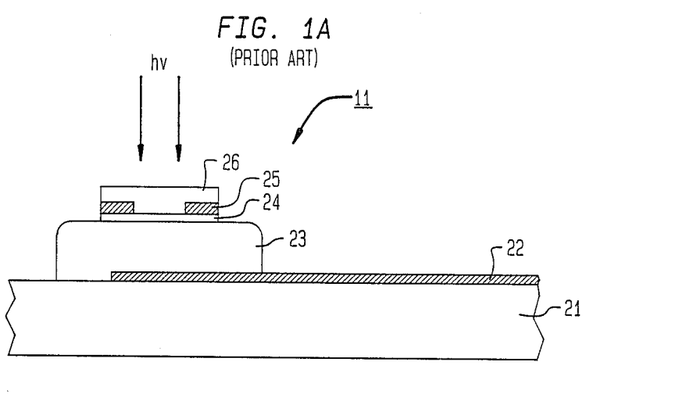
FIG. 1(a) is a sectional view of a photo sensor element in the prior art and FIG. 1(b) is a plan view of a contact type color image sensor array in the prior art which uses the photo sensor shown in FIG. 1(a)
Figure 1B:
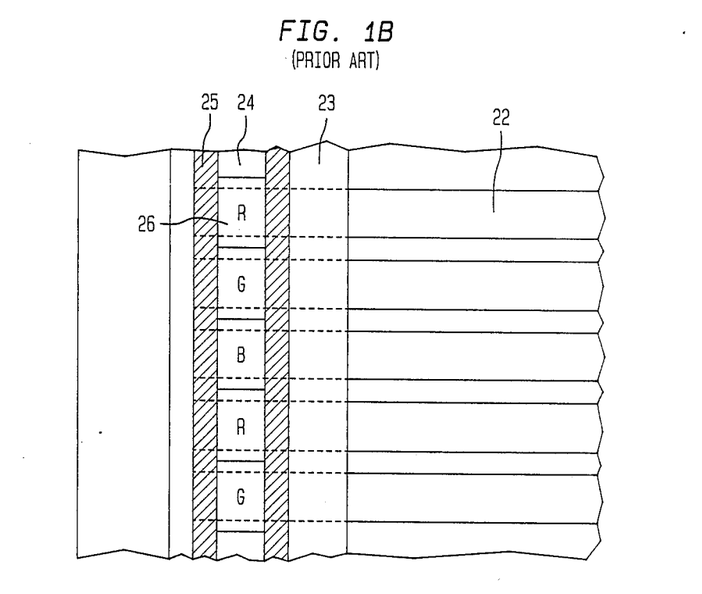

The conventional contact type color image sensor array was formed by fabricating a plurality of photo sensor elements 11 on an insulating substrate 21 such as glass, as shown in FIGS. 1(a) and 1(b). A plurality of individual electrodes 22 of chromium were formed on the substrate 21 in parallel with each other. A layer of α-Si 23 was deposited to cover one end of the individual electrodes 22. A layer of common electrode 24 of transparent conductor material was formed on the α-Si 23 to cover the one end of the individual electrodes 22. The photo-diodes were formed in the α-Si 23 or the interface of the α-Si 23 and the common electrode. The photo-diodes in the α-Si 23 were formed by introducing P- and N-type impurities into the α-Si 23 to form PN-junctions or PIN junctions. Alternately, photo-diodes at the interface were fabricated by using an undoped material as the α-Si 23 and indium tin oxide as the common electrode to form Schottky junctions. Another type of photo-diode was an MOS type which was formed by forming a transparent insulator between the α-Si 23 and the common electrode 24.

A photo-shield 25 of chromium was deposited on the common electrode 24 to improve the resolution of a reproduced picture, but might be removed. Filters 26 were formed on the common electrode 24 and the photoshield 25. The filters 26 includes red filters R, blue filters B and green filters G each covering the photo-diode on the respective individual electrodes 22. The red, green and blue filters R, G, B were arranged repeatedly in a line in this order.

Figure 2:
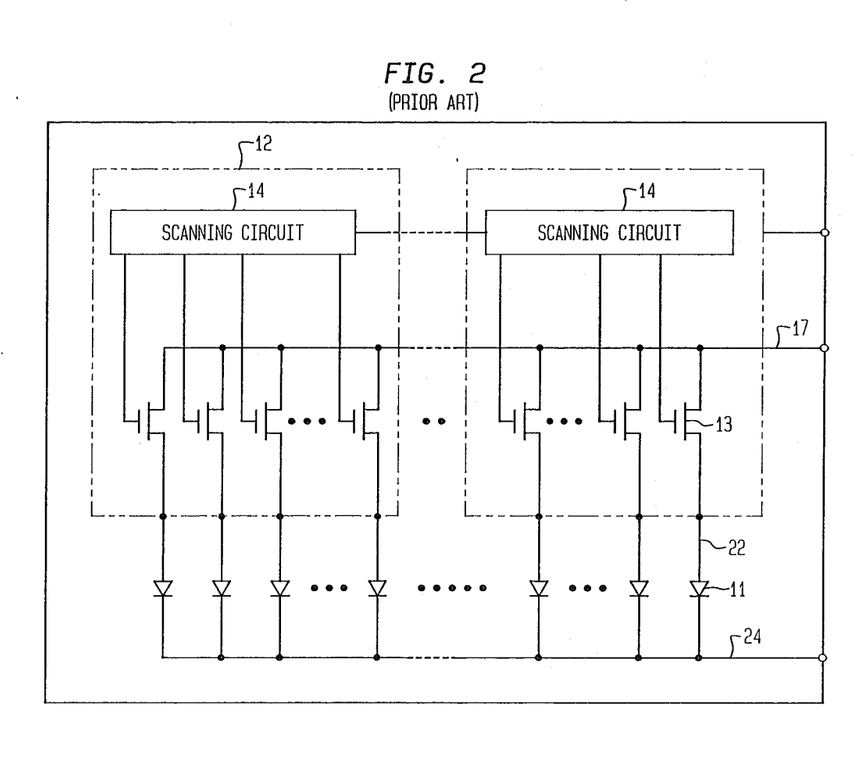
FIG. 2 is a circuit diagram of the contact type color image sensor in the prior art which includes a driving circuit.

The contact type color image sensor array was driven by scanning FET's 13 each connected between the respective individual electrodes 22 and an output line 17, as shown in FIG. 2. Such scanning was controlled by scanning circuits 14 using a shift register, for example. The FET's 13 and the scanning circuits 14 were formed on integrated circuit devices 12.

One picture element of color image was reproduced from outputs of three photo sensor elements having a red filter R, a blue filter B and a green filter G. The resolution of the reproduced picture was less than one third of the reproduced picture of a monochrome picture. This resolution may be improved by increasing the density of photo sensor elements in their line. This measurement results in a decrement of surface area of each photo sensor element, and therefore, in a deterioration of the S/N ratio in the output signal due to a decrement of accumulated photo carriers.

The resolution may also be improved, if the photo sensor elements are formed in three lines, each line being formed by photo sensors having the same color filters. In facsimile or copying equipment, the photo sensor array is moved on a document in a direction perpendicular to the line of the photo sensor elements. The resolution in the direction perpendicular to the line can be improved by increasing the scanning speed. The resolution in the direction parallel with the line may be improved by the above-mentioned three line photo sensor structure. However, this three line structure faces another problem of deteriorated color fidelity.

More specifically, although each line of photo sensor elements may be independently driven by controlling potentials at the respective common electrodes in the three lines of photo sensor elements, the photo carriers accumulated in one photo sensor element on one individual electrode flow to the individual electrode together with the photo carriers accumulated in the other two photo sensor elements on the same individual electrode in response to a drive of the individual electrode. This deteriorates the color fidelity of the reproduced picture.

Figure 3A:
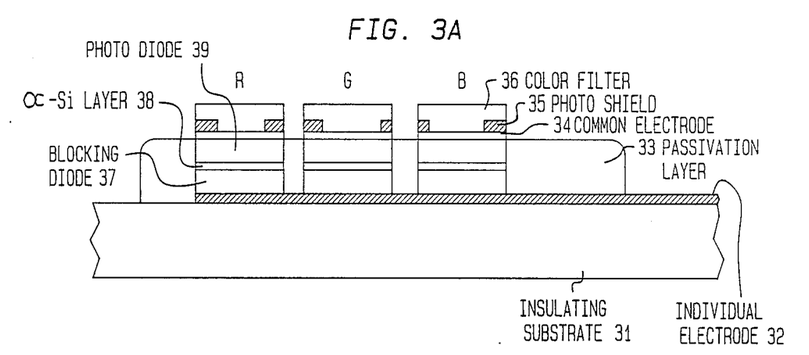
FIG. 3(a) is a sectional view of photo sensor elements of a first preferred embodiment of the present invention and FIG. 3(b) is a plan view of a contact type color image sensor array according to the first preferred embodiment.
Figure 3B:
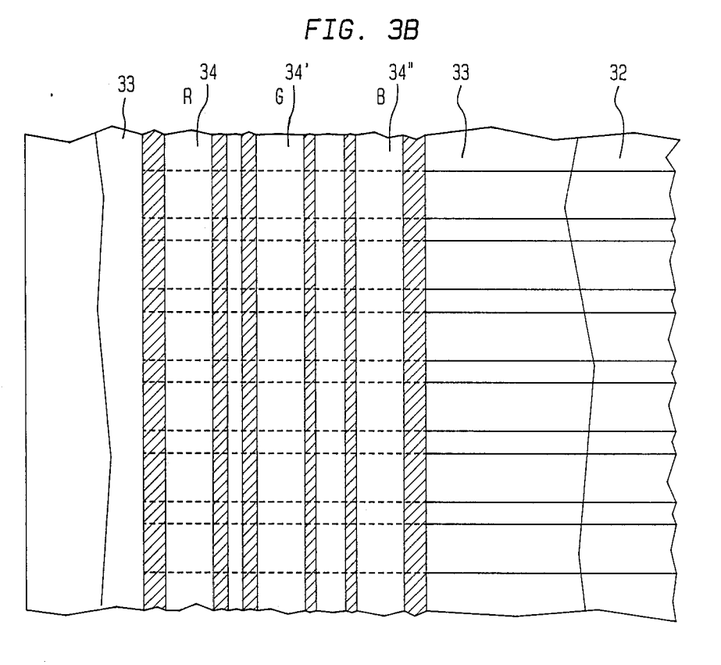

A first preferred embodiment has three lines of photo sensor elements on an insulating substrate 31 such as glass. A plurality of individual electrodes 32 are formed by depositing chromium with a thickness of 700 Å and etching it to form stripes having a width of 100 μm. A line density of eight elements/mm is obtained by the 100 μm width. Blocking diodes 37, α-Si layers 38 and photo diodes 39 are consecutively formed on the ends of the respective individual electrodes 32. These may be formed by a consecutive deposition of α-Si. The α-Si is generally deposited by the method of decomposition of SiH$_4$ or Si$_2$H$_6$ gas in a glow discharge. The α-Si is subjected to a selective etching to form a plurality of square islands of 100 μm×140 μm, and followed by a deposition of SiO₂ of 1 μm as a passivation layer 33. Three common electrodes 34, 34' and 34" are formed on the photo-diodes 39 perpendicular to the lines of common electrodes 32. Each of the blocking diodes 37, the α-Si layers 38 and the photo diodes 39 are piled at each crossing between the individual electrodes 32 and the common electrodes 34, 34' and 34". The blocking diodes 37 may be formed as PN junction diodes or PIN junction diodes by introducing P and N type impurities, as Schottky junction diodes by using an undoped α-Si as the α-Si and chromium as the individual electrodes 32 or as MIS type diodes by interposing an insulating layer between the α-Si and the individual electrodes 32. Here, the Schottky junction diodes are employed. Similarly, the photo diodes 39 may be formed as PN or PIN junction diodes, Schottky junction diodes or MIS type diodes. This embodiment employs the Schottky junction diodes by using an undoped α-Si as the α-Si and indium tin oxide as the common electrodes 34, 34' and 34". The thickness of α-Si layer 38 is 1,000 Å, for example. The thickness of α-Si's for the photo diodes 39 and the blocking diodes 37 are respectively 1 μm.

After the passivation layer 33 on the photo diodes 39 is etched away, three common electrodes 34, 34' and 34" are then formed by evaporating transparent conductor material such as indium tin oxide with a thickness of 0.06 μm, photo-shields 35 are formed by evaporating chromium with a thickness of 1,500 Å to expose the common electrodes 34, 34' and 34" at the centers of respective photo-diodes 39. This photo-shield 35 is formed to improve the resolution, but may be omitted. Finally, color filters 36 cover the exposed common electrodes 34, 34' and 34" and the photo-shields 35. Three types of color filters 36 are used, red filters R, green filters G and blue filters B. The same color filters are formed on the same common electrode so as to form lines of red filters R, green filters G and blue filters B in parallel. The preparation of the color filters 36 will be explained. After polymer resin is coated, three types of dyes are permeated. The examples of dyes are Eastmanpolyesterblue 4RL (a trade name) for blue, Eastmanpolyesterred 901 (a trade name) for red and a mixture of Eastmanyellow R-GFD and Eastmanblue BGN (both are trade names) for green. The shape of each color filter is a square of 180 μm×220 mm. Other sets of color filters are also applicable in place of red, blue and green filters. The examples of other sets are white, yellow and cyan, white, green and cyan, white, green and yellow and green, cyan and yellow.

Figure 4:
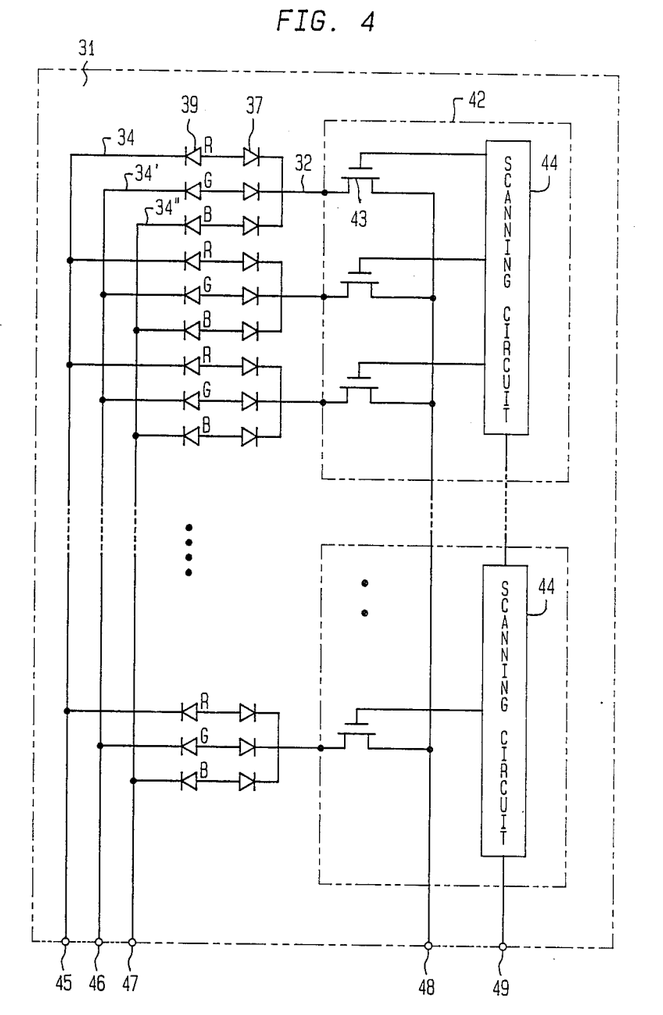
FIG. 4 is a circuit diagram of the color image sensor according to the first preferred embodiment which includes a driving circuit.
Figure 5:
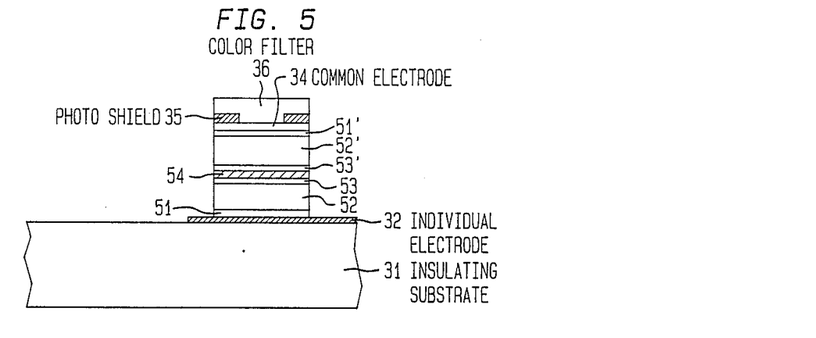
FIG. 5 is a sectional view of the blocking diode and the photo diode for illustrating first and second examples of them.

The circuit for driving the color image sensor array is shown in FIG. 4. Respective common electrodes 34, 34' and 34" are connected on the insulating substrate 31 with terminals 45, 46 and 47. The individual electrodes 32 are respectively connected with an output terminal 48 through MOS type FET's 43. The output terminal is typically grounded through an external resistor to produce output potentials. The MOS type FET's 43 are scanned by scanning circuits 44. An example of the scanning circuits 44 is a shift register shifting an input pulse applied at a terminal 49. As shifting of the input pulse occurs, FET's 43 are sequentially driven into a conductive state. The terminals 45, 46 and 47 are also scanned to sequentially raise their potentials to a value necessary to forward bias the photo diodes 39 from a grounding potential. The potential to bias the photo diodes 39 forward is six volts, for example.

As is apparent from the drawings of FIGS. 1(a) and 1(b), three photo sensor elements for detecting three primary colors are formed on one individual electrode. One picture element of color image is formed by outputs from those three photo sensor elements. Therefore, the resolution in a direction perpendicular to the individual electrodes 22 is held at high level. To obtain such high resolution, the area of each photo sensor element is not made small. Sufficient photo carriers can be accumulated in each photo sensor element. This fact keeps the S/N ratio in an output signal at high.

Further, one photo diode 39 in one photo sensor element is forward biased to allow the accumulated photo carriers therein to flow to the output terminal 48, in response to the scannings of the FET's 43 and the terminals 45, 46 and 47. At this time, the selected individual electrode 32 is connected to the other two photo sensor elements. However, the flows of photo carriers from photo diodes in the non-selected two photo sensor elements are blocked by the blocking diodes 37. Thus, photo carriers in non-selected photo sensor elements do not mix in an output from the selected photo sensor element, resulting in high color fidelity of a reproduced picture.

Furthermore, one blocking diode 37 and one photo diode 39 are piled through α-Si layer 38. This structure saves area on the insulating substrate 31 and makes it possible to widen each photo sensor element in a direction parallel with the individual electrodes 32. The wide photo sensor elements further improve the S/N ratio in output signals.

In the above-mentioned first embodiment, the α-Si layer 38 is preferably N type material. But any other conductive materials which form ohmic contact with α-Si's in the blocking diode 37 and the photo diode 39 may be replaced therefor.

In FIGS. 5 to 8, other examples of the blocking diode 37 and the photo diode 39 are shown in sectional views, first example uses NIP diodes. On a stripe of individual electrode 32, an N type α-Si 51 is deposited with a thickness of 500 Å followed by depositions of undoped high resistive α-Si 52 having a thickness of 5,000 Å and a P type α-Si 53 having a thickness of 600 Å to form a blocking diode 37 of NIP junction type. A conductive α-Si layer 54 of N type α-Si is deposited on the P type α-Si 53 with a thickness of 2,000 Å. This may be replaced with other appropriate conductive material forming an ohmic contact with the P type α-Si 53, or otherwise omitted by using a thick P type α-Si as the α-Si 53. On the conductive α-Si layer 54, a P type α-Si 53' of 500 Å, a nondoped high resistive α-Si 52' of 5,000 Å and an N type α-Si 51' of 200 Å are consecutively deposited to form a photo diode 38 of NIP junction type. As explained with reference to FIG. 3(a), the common electrode 34, the photo shield 35 and the color filter 36 are formed on the photo diode. Here, it is apparent to one skilled in the art that the conductivity types of the α-Si's 51 and 51' and the α-Si's 53 and 53' may be changed from N type to P type and P type to N type, respectively, to form PIN junction diodes. Here, boron may be slightly doped in the high resistive α-Si's 52 and 52'.

The second example uses an NIP junction diode and a diode using a heterojunction as the blocking diode 37 and the photo diode 38. Since the sectional view is the same as FIG. 5, this second example will be explained with reference to the same sectional view of FIG. 5. A P-type amorphous silicon carbide is used for the P-type α-Si 53' only. The silicon carbide may be deposited by decomposing a mixture of gas of $SiH_4$ or $Si_2H_6$ and a gas of $CH_4$ or $C_2H_6$ in a glow discharge atomosphere. This decomposition may be performed in the same apparatus as used for the decomposition of α-Si, the undoped high resistive α-Si, the N type α-Si and the P type α-Si are used for the α-Si's 52 and 52' and the α-Si's 51 and 51' and the α-Si 53, similar to the first example. The conductive α-Si layer 54 is also the same. The heterojunction type photo diode using the amorphous silicon carbide has a good sensitivity to the visible radiation of a wavelength between 400 mm and 500 mm.

Figure 6:
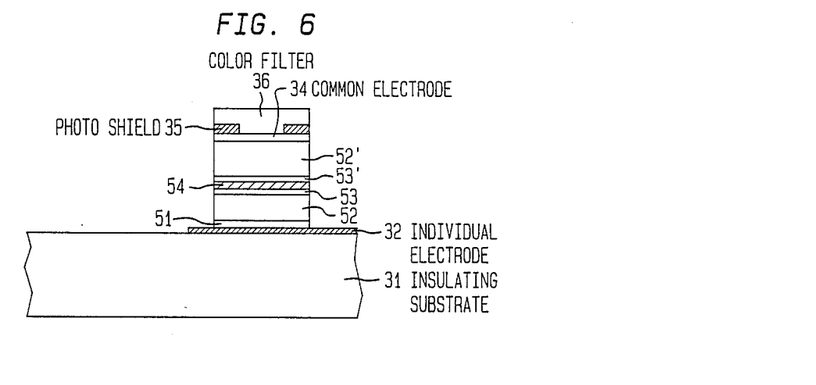
FIG. 6 is a sectional view of the blocking diode and the photo diode for illustrating a third example of them.

The third example shown in FIG. 6 uses a Schottky junction diode as the photo diode 38 and an NIP junction diode as the blocking diode 37. In this example, the N type α-Si 51' is removed from the first example to allow a direct contact between the undoped high resistive α-Si 52' and the common electrode 34. Such direct contact forms a Schottky junction, if the appropriate transparent conductor material such as indium tin oxide is employed as the common electrode 34.

Figure 7:
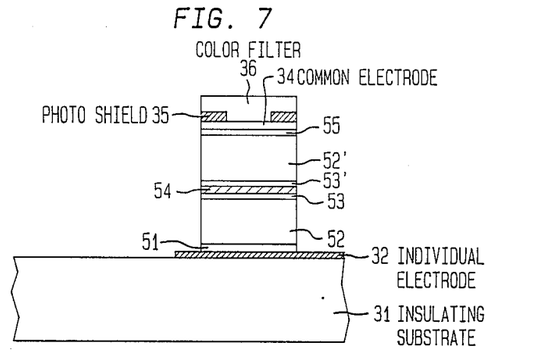
FIG. 7 is a sectional view of the blocking diode and the photo diode for illustrating a fourth example of them.

The fourth example shown in FIG. 7 uses an MIS type diode as the photo diode 38 and an NIP junction diode as the blocking diode 37. The blocking diode is formed by an N type α-Si 51 of 1,000 Å, an undoped high resistive α-Si 52 of 7,000 Å and a P type α-Si 53 of 1,000 Å, similar to the above-explained first to third examples. The photo diode 38 is formed by a P type α-Si 53 of 1,000 Å, an undoped high resistive α-Si 52' of 7,000 Å, an insulator layer 55 of 200 to 300 Å such as silicon nitride or silicon oxide, and the common electrode 34. The silicon nitride may be formed by decomposing a gas mixture of a gas of $SiH_4$ or $Si_2H_6$ and a gas of $NH_3$ or $N_2$ in a glow discharge atomosphere. Similarly, the silicon oxide may be formed by decomposing a gas mixture of a gas of $SiH_4$ or $Si_2H_6$ and a gas of $N_2O$, $CO_2$ or $O_2$ in a glow discharge atomosphere. These decompositions may be performed in the same apparatus as the decomposition of α-Si to allow the continuous depositions of α-Si and the insulator material. The undoped high resistive α-Si's 52 and 52' may be slightly doped with boron.

Figure 8:
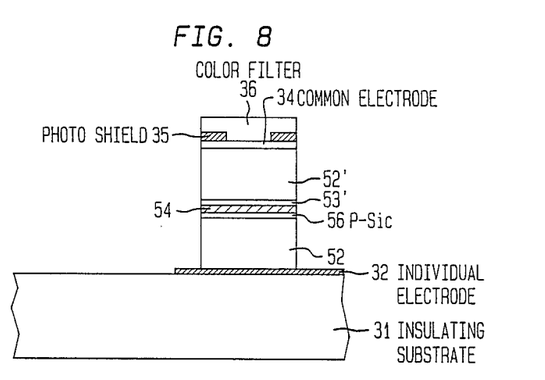
FIG. 8 is a sectional view of the blocking diode and the photo diode for illustrating a fifth example of them.

The fifth example shown in FIG. 8 uses a Schottky junction diode as the photo diode 38, a combination diode of a Schottky junction and a heterojunction as the blocking diode 37. A high resistive α-Si 52 is directly deposited on the individual electrode 32 of chromium to form a Schottky junction. A P type silicon carbide 56 is deposited on the high resistive α-Si 52 to form a heterojunction. The blocking diode 37 is formed by a combination of the Schottky junction and the heterojunction. A P type α-Si 53' is deposited on the blocking diode via a conductive α-Si 54. Another high resistive α-Si 52' is then deposited. A common electrode 34 of indium tin oxide is formed on the high resistive α-Si 52 to form a Schottky junction. The photo diode 38 uses the Schottky junction. Here, the high resistive α-Si's 52 and 52' may be undoped α-Si or α-Si doped slightly with boron.

Figure 9:
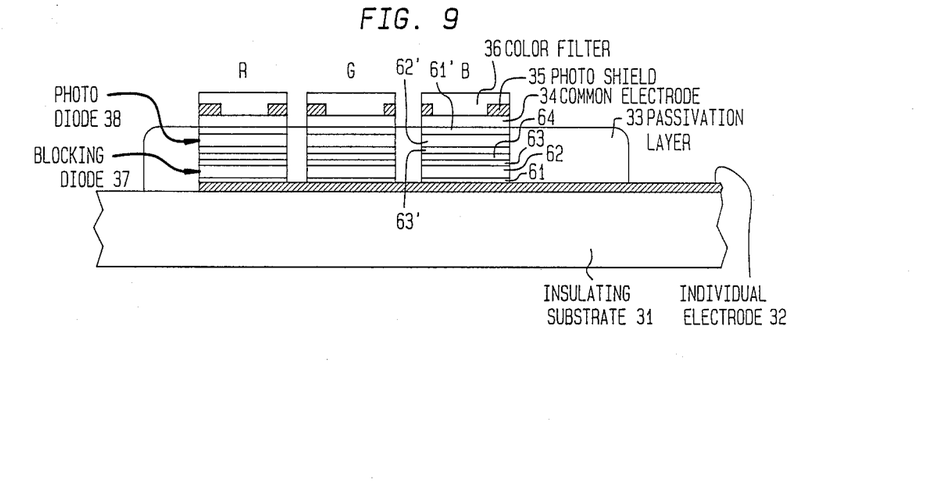
FIG. 9 is a sectional view of a second preferred embodiment of the present invention.

A second preferred embodiment has a structure similar to the first preferred embodiment, as shown in FIG. 9. The plan view is same as FIG. 3(b) and the same reference numerals are used in FIG. 6 except for the structure of the photo diodes 38 and the blocking diodes 37. The blocking diodes 37 are formed on the individual electrode 32 by depositing an N type α-Si 61, an undoped high resistive α-Si 62 and a P type α-Si 63 to form NIP junction diodes. Molybdenum is then deposited with a thickness of 1,000 Å to form a photo-shield layer 64. The photo diodes 38 are, thereafter, formed on the photo-shield layer 64 by depositing a P type α-Si 63', an undoped high resistive α-Si 62' and an N type α-Si 61' to form NIP type diodes.

The photo-shield layer 64 prevents the radiated light from permeating the blocking diodes 37. If the light permeates the blocking diodes 37 through the photo diodes 38, photo carriers are generated in the blocking diode and flow to the individual electrodes 32. Such additional photo carriers generated in unselected photo sensor elements on the selected individual electrode 32 flow to the selected individual electrode 32 together with the photo carriers generated in the selected photo sensor element, resulting in a deterioration of color fidelity of the reproduced picture. The photo-shield layer 64 of molybdenum prevents such deterioration of color fidelity by blocking the penetration of light. Therefore, the material of the photo-shield layer is not limited to molybdenum but may be other conductive material such as aluminum, nickel, chromium, platinum and conductive carbon, which performs an ohmic contact with both the P type α-Si's 63 and 63' and has a thickness sufficient to block the light.

The photo diodes 38 and the blocking diodes 37 may be formed as PIN junction diodes, heterojunction diodes or Schottky junction diodes, as explained in the first to fifth examples of the first preferred embodiment. The intermediate layer of conductive α-Si 54 is replaced with the photo-shield layer 64 of conductive metal or the like.

Figure 10:
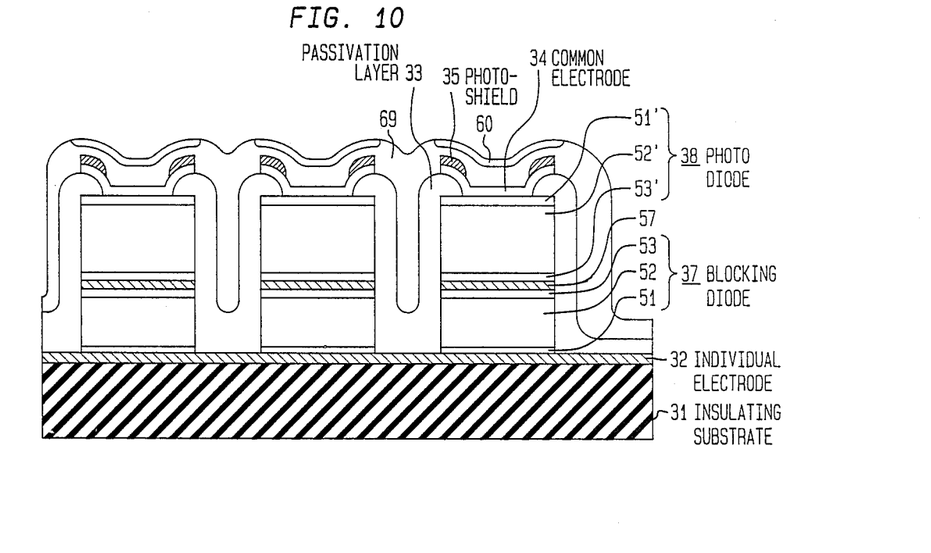
FIG. 10 is a sectional view of a third preferred embodiment of the present invention.

A third preferred embodiment also has the same plan view as FIG. 3(b). Only the sectional view is shown in FIG. 10. The passivation layer 33 of silicon oxide, the polymer resin 69 and the color filters are expressed in more detail than FIGS. 3(a) and 9. The passivation layer 33 of $SiO_2$ is deposited at a thickness of 0.8 μm to prevent current from flowing through a side surface of the photo sensor elements. The passivation layer 33 is removed at center portions of the upper surfaces of the photo sensor elements to expose the center portions. A transparent common electrode 34 of indium tin oxide of 0.06 μm covers the exposed center portions and adjacent surfaces of the passivation layer 33. Photo shield layers 35 of chromium having a thickness of 0.1 μm are deposited on the common electrodes 34 except for portions on the exposed center portions. The polymer resin 61 is then coated to cover the passivation layer 33, the common electrode 34 and the photo shield layer 35. Thereafter, thermally diffusing dyes into the polymer resin 69 at the portions above the photo sensor elements, forms color filters 60 of red, blue and green.

The photo sensor elements respectively consist of a photo diode 38, a blocking diode 37 and a photo absorber 57 interposed therebetween. The photo diodes 38 and the blocking diodes 37 are NIP junction diodes formed by N type α-Si's 51 and 51', high resistive α-Si's 52 and 52' and P type α-Si's 53 and 53'. The high resistive α-Si's 52 and 52' may be undoped α-Si or α-Si doped slightly with boron. The photo absorber 57 operates as the photo shield layer 64 of the second preferred embodiment by absorbing light which permeates the photo diodes. An example of the material for the photo absorber 57 is amorphous germanium having a thickness of 0.2 μm which is deposited by a decomposition of germane ($GeH_4$) in a glow discharge atmosphere. The material for the absorber 57 may be amorphous silicon germanium which is deposited by a decomposition of a gas mixture of germane (GeH$_4$) and silane (SiH$_4$) in a glow discharge atmosphere, as described in "Journal of Electrochemical Society" December 1982, pages 2850 to 2855. These absorbers 57 can be formed in the same apparatus as that for depositing α-Si. Therefore, the blocking diodes 37, the absorbers 57 and the photo diodes 38 can be continuously formed in the same apparatus. The amorphous germanium has a low resistivity without doping impurities, but the amorphous silicon germanium must be lowered in its resistivity by doping impurities. The light having a wavelength of about 650 nm passes the α-Si photo diode, but is absorbed by the amorphous germanium or the amorphous silicon germanium. Thus, a high color fidelity in the reproduced picture is obtained, as explained in the second preferred embodiment. It is needless to say that the structure of the first to fifth examples may be applicable to the blocking diodes 37 and the photo diodes 38 of the third preferred embodiment with a replacement of the intermediate layer of the conductive α-Si 54 with the amorphous germanium or the amorphous silicon germanium.

Figure 11:
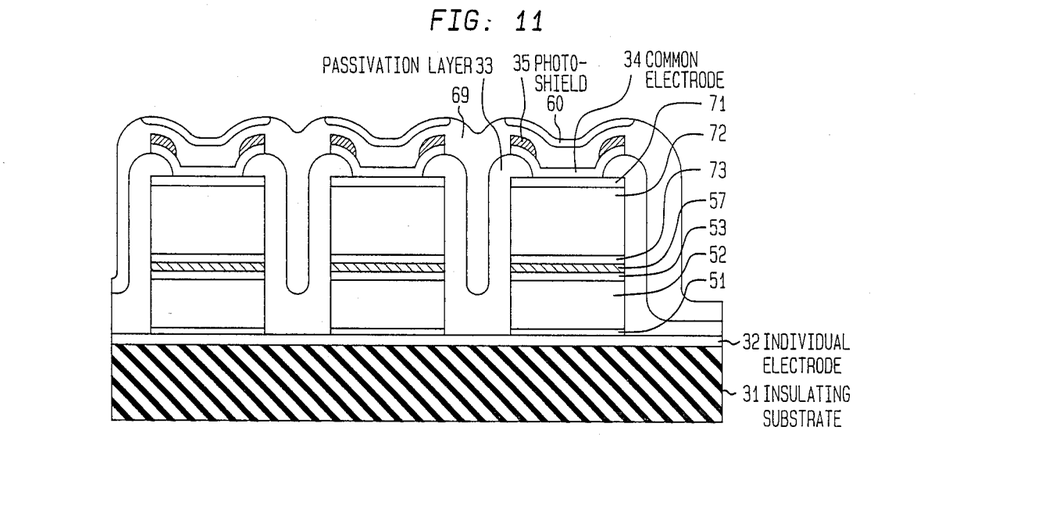
FIG. 11 is a sectional view of a fourth preferred embodiment of the present invention.

A fourth preferred embodiment shown in FIG. 11 has the same structure as the third preferred embodiment except for the photo sensor elements. The photo sensor elements cnsist of a blocking diode 37, a photo diode 38 and a light absorber 57 interposed therebetween, similar to the third preferred embdoiment. The blocking diodes 37 are NIP junction diodes formed of an N type α-Si 51 of 0.2 μm, a high resistive α-Si 52 of 0.6 μm and a P type α-Si 53 of 0.2 μm. The light absorber 57 is undoped amorphous germanium of 0.2 μm or impurity doped amorphous silicon germanium of 0.4 μm. The photo diodes 38 are NIP junction diodes formed of a P type amorphous silicon germanium 73 of 0.2 μm, a high resistive amorphous silicon germanium 72 of 0.6 μm and an N type amorphouse silicon 71.

Since the α-Si, the amorphous germanium and the amorphous silicon germanium are formed in the same apparatus by decomposing silane, germane, or a mixture of silane and germane respectively, all the blocking diodes 37, the light absorbers 57 and the photo diodes 38 can be continuously formed in the same apparatus. Furthermore, since the photo diodes 38 use amorphous silicon germanium, the red light having a wavelength of about 650 mm is absorbed in the photo diodes 38 to prevent light more effectively from arriving at the blocking diodes 37. Generally, the increment of the germanium ratio in the amorphous silicon germanium enhances the red light absorbing effect but deteriorates the leakage current of photo diodes. Therefore, the germanium is contained in the material forming the photo diode with such value that the leakage current may not be increased. More specifically, uppermost N type layer 71 does not container amorphous germanium, the high resistive layer 72 and the lowest P type layer 73 contain amorphous germanium of 30%. As a result, an excellent color fidelity is obtained in the reproduced picture.

The present invention can be used to improve the resolution of a monochrome image. The linear image sensor shown in FIGS. 1(a) and 1(b) arranges a plurality of photo sensor elements in a line, but there is some space between adjacent photo sensor elements. Those spaces can be removed by the structure shown in FIGS. 12(a) and 12(b). Each individual electrode 122 bends twice at a right angle on an insulating substrate 121 to have first and second straight portions in parallel. While a first photo sensor element 130 is formed at an end of the first straight portion, a second photo sensor element 130' is formed at an end of the second straight portion so as to occupy the intermediate portions between the first photo sensor elements 130. Each photo sensor element (130 and 130') is formed of a blocking diode 131, a conductive or photo-shield layer 132 such as conductive α-Si, molybdenum, amorphous germanium and amorphous silicon germanium, and a photo diode 132 which are consecutively piled on an individual electrode 122. Any structure explained in the first to fifth examples may be used as the blocking diode 131, the conductive or photo-shield layer and the photo diode 132. Transparent conductive layers such as indium tin oxide are covered on the photo diodes 132 of the first and second lines 135 and 136 as common electrodes 124. All the surface edges of the photo diodes 133 are covered by a photo shield 125 by chromium. A monochrome filter may be covered on the common electrodes 124. A passivation layer 134 of silicon oxide film protects the side of the photo sensor elements.

Figure 12A:
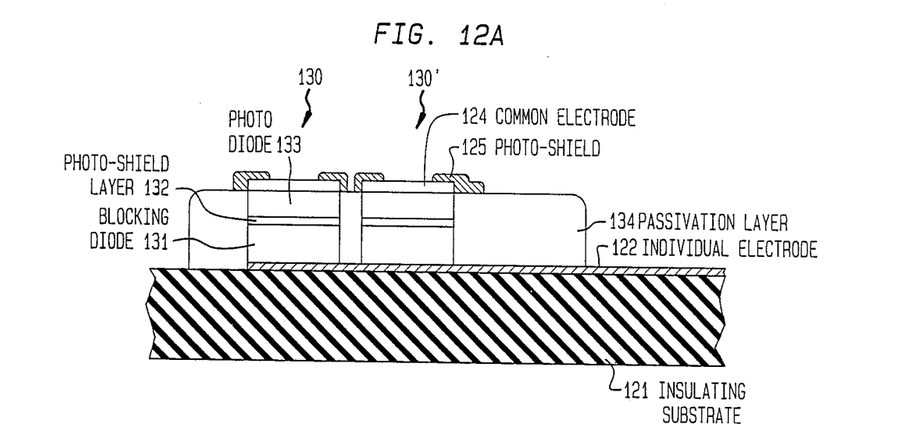
FIG. 12(a) is a sectional view of a fifth embodiment in which the present invention is applied to a monochrome linear image sensor and FIG. 12(b) is a plan view of the fifth embodiment, FIG. 12(a) being a section along the line A-A' in FIG. 12(b)
Figure 12B:
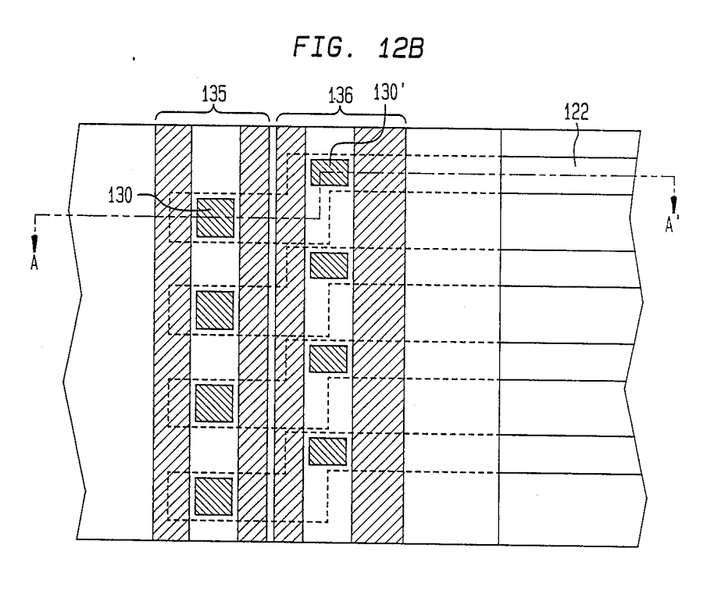

By scanning the individual electrodes 122 and the common electrodes 124, photo carriers are consecutively outputted from the photo diodes 135 of the first and second lines 135 and 136 of sensors. Such scanning may be made similar to the first to fourth preferred embodiments. Here, since the photo sensor elements 130' of the second line 136 of sensors are positioned between adjacent photo sensor elements 130 of the first line 135 of sensors, the spaces between the photo sensor elements 130 and 130' in the direction parallel with the first and second lines 135 and 136 of sensors are saved, resulting in an improvement of resolution of the reproduced picture. The photo carriers are independently outputted from the photo diodes of the photo sensor elements 130 and 130', similar to the first to fourth preferred embodiments.

Figure 13A:
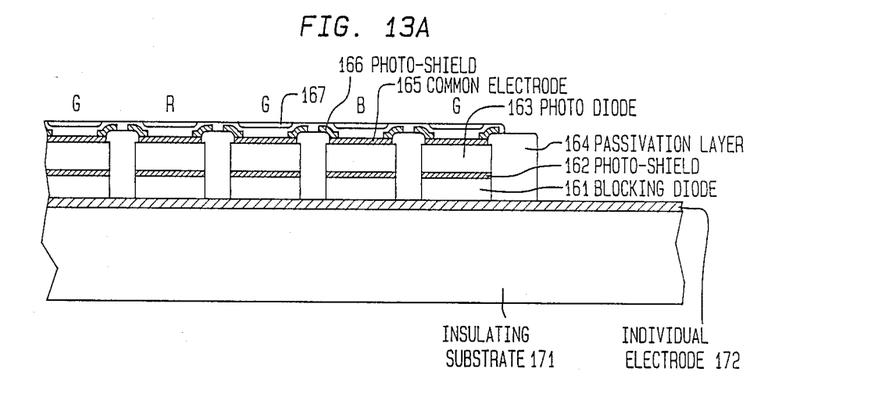
FIG. 13(a) is a sectional view of a sixth embodiment in which the present invention is applied to a area image sensor and FIG. 13(b) is a plan view of the sixth embodiment of FIG. 13(a)
Figure 13B:
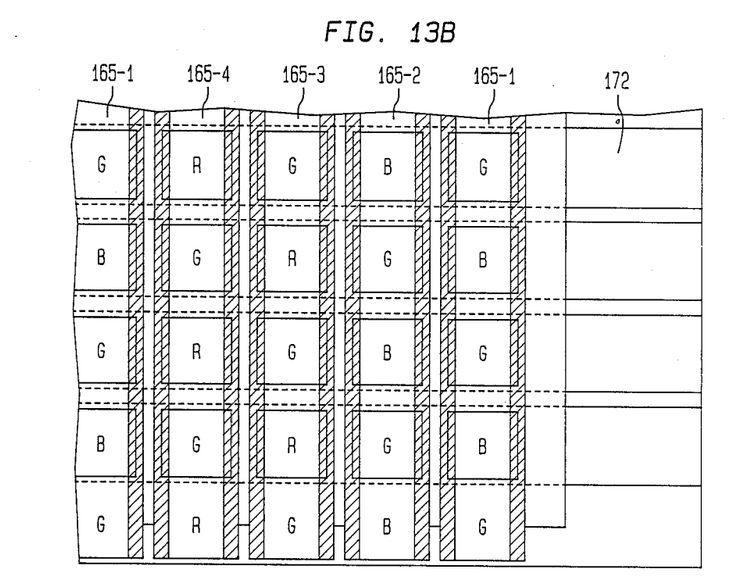

The present invention can be also used in an area image sensor as shown in FIGS. 13(a) and 13(b). A plurality of individual electrodes 172 are formed on an insulating substrate 171 in parallel with each other. A plurality of photo sensor elements are formed on every individual electrode 172 by piling a blocking diode 161, a conductive or photo-shield layer 162 and a photo diode 163 consecutively. The first to fifth examples explained are applicable to the structure of the blocking diode 161, the conductive or photo-shield layer 162 and the photo diode 163. A passivation layer 164 of silicon oxide film protects side edges of the photo sensor elements. A plurality of common electrodes 165 are formed to cover photo diodes 163 so as to cross the individual electrodes 172 and are formed of transparent conductive material such as indium tin oxide. A photo shield 166 of chromium convers edges of every photo diode 163. At every part of the common electrodes 165 upon the photo diodes 163, color filters 167 are formed. One example of the color filters 167 are red filter R, blue filter B and green filter G. While, the green and blue filters G and B are alternatively formed on the common electrode 165-1, the same filters G and B are reversely formed on the common electrode 165-2. While the green and blue filters G and R are alternately formed on the common electrode 165-3, the same filters G and R are reversely formed on the common electrode 165-4.

Figure 14:
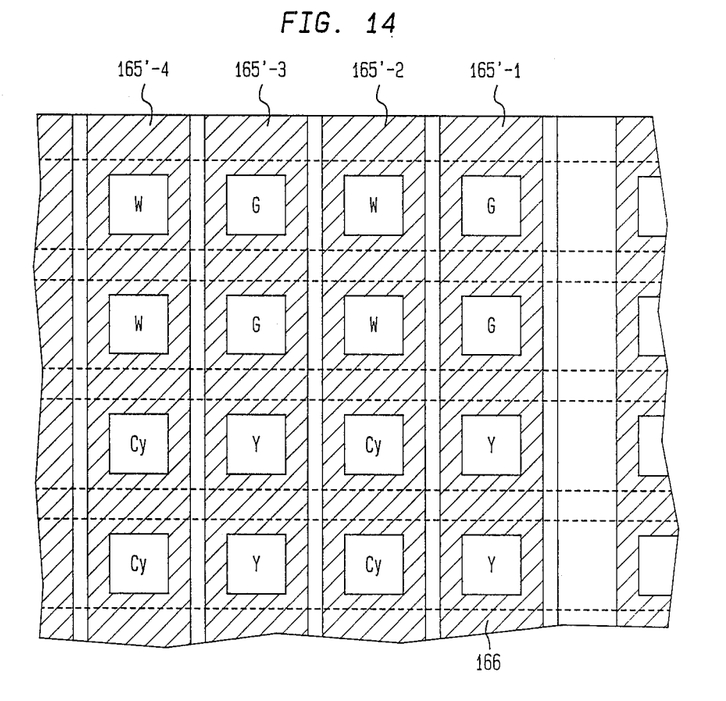
FIG. 14 is a plan view of another example of the sixth embodiment.

FIG. 14 is another example of color filter arrangement. The structure is the same as FIGS. 13(a) and 13(b) but the photo shield 166 covers all the common electrodes 165'-1, 165'-2, 165'-3 and 165'-4 except central portions of the photo diodes 163. The color filters 167 use white filtesr W, green filters G, yellow filters Y and cyan filters Cy. On the common electrode 165'-1, two green filters G and two yellow filters Y are repeatedly arranged. On the common electrode 165'-2, two white filters W and two cyan filters Cy are repeatedly arranged. On the common electrode 165'-3, two green filters G and two yellow filters Y are repeatedly arranged. On the common electrode 165'-4, two white filters W and two Cyan filters Cy are repeatedly arranged. The arrangement of 4×4 filters are repeated on the image sensor.

The feature and advantages explained in all the first to fourth preferred embodiments are similarly achieved in this sixth embodiment. Especially, since the blocking diode and the photo diode are piled through the conductive or photo-shield layer, all the photo sensor elements are integrated on an insulating substrate compactly. The color fidelity in the reproduced picture is excellent.

Although the present invention has been explained above with reference to the limited embodiments, it is apparent to one skilled in art that the present invention is not limited to the explained embodiments. The common electrodes may be formed on the insulating substrate using transparent material with the photo diodes formed on the common electrodes and then blocking diodes formed thereon. The color filters used in this modification may be formed on any one surface of the substrate.

What is claimed is:

1. An image sensor array comprising:
   a substrate having an insulating surface;
   a plurality of elongated individual electrodes formed on said insulating surface, said individual electrodes being elongated in a first direction and arrayed in parallel with each other;
   a plurality of blocking diodes formed on said individual electrodes, at least two blocking diodes being formed on one individual electrode and disposed in said first direction, said blocking diodes being arranged in at least two lines in a second direction perpendicular to said first direction;
   a plurality of photo diodes, each formed on each of said blocking diodes, said photo diodes being thus arranged in at least two lines in said second direction; and
   at least two common electrodes of a transparent conductor material running in said second direction, each of said common electrodes being connected to said photo diodes of each line thereof.

2. An image sensor array as claimed in claim 1, wherein three of said blocking diodes and three of said photo diodes are formed on the respective individual electrodes with three of said common electrodes, and which further comprises filters formed on said common electrodes upon said photo diodes, said filters having first color filters of a first color, second color filters of a second color and third color filters of a third color to sense a color image, and each of said first, second and third color filters respectively covering said photo diodes on the respective individual electrodes.

3. An image sensor array as claimed in claim 2, wherein said image sensor further includes photo-shielding layers interposed between said blocking diodes and said photo diodes, respectively.

4. An image sensor array as claimed in claim 3, wherein said photo shielding layers are made of one of a metal and a conductive amorphous material.

5. An image sensor array as claimed in claim 3, wherein said photo shielding layers are made of a material selected from a group of molybdenum, aluminium, nickel, chromium, platinum, a conductive carbon, amorphous germanium and amorphous silicon germanium.

6. An image sensor array as claimed in claim 3, wherein said blocking diodes and said photo diodes are made of amorphous silicon and said photo shielding layers are made of one of said amorphous germanium and said amorphous silicon germanium.

7. An image sensor array as claimed in claim 2, wherein said image sensor array further includes layers of conductive amorphous silicon interposed between said blocking diodes and said photo diodes.

8. A color image sensor array comprising:
   a substrate having an insulating surface;
   a plurality of individual electrodes formed on said insulating surface and elongated in a first direction and in parallel with each other;
   a plurality of blocking diodes formed on the individual electrodes, three of said blocking diodes being disposed on the respective individual electrodes in said first direction, said plurality of blocking diodes being arranged in three lines in a second direction perpendicular to said first direction;
   a plurality of photo diodes disposed on said blocking diodes to form series connections of one of said blocking diodes and one of said photo diodes and arranged in three lines in said second direction;
   three common electrodes of a transparent conductor material running in said second direction, each of said three common electrodes covering said photo diodes of each line; and
   color filters covering portions of said common electrodes above said photo diodes, said color filters having first filters of a first color covering each one of said photo diodes of one of the three lines, second filters of a second color covering said photo diodes of a second one of the three lines, and third filters of a third color covering said photo diodes of a third one of the three lines, and said first, second and third colors being colors required for sensing a color image.

9. A color image sensor array as claimed in claim 8, wherein said color image sensor array further includes a photo-shielding layer interposed between each of said blocking diodes and each of said photo diodes thereon.

10. A color image sensor array as claimed in claim 9, wherein said photo-shielding layer is made of metal.

11. A color image sensor array as claimed in claim 10, wherein said metal is one of a group consisting of molybdenum, aluminium, nickel, chromium and platinum.

12. A color image sensor array as claimed in claim 9, wherein said blocking diodes and said photo diodes are formed of amorphous silicon and said photo-shielding layer is made of a material selected from a group of amorphous germanium and amorphous silicon germanium.

13. An image sensor array comprising:
   a substrate having an insulating surface;
   a plurality of elongated individual electrodes formed on said insulating surface in parallel with each other, said individual electrodes respectively having first and second elongated parallel portions and a connecting portion between said first and second portions, said second portions being in an offset position between adjacent first portions;

a plurality of blocking diodes disposed on said individual electrodes, at least two of said blocking diodes being respectively formed on said first and second portions of said individual electrodes;

a plurality of photo diodes respectively disposed on said blocking diodes;

at least two common electrodes of transparent conductor material formed on respective ones of said photo diodes on the respective individual electrodes; and a plurality of monochrome filters covering portions of said common electrodes above said photo diodes.

* * * * *